United States Patent
Shiino et al.

(10) Patent No.: US 8,026,506 B2
(45) Date of Patent: Sep. 27, 2011

(54) THIN-FILM TRANSISTOR WITH CHANNEL LAYER FORMED BY METAL OXIDE FILM INCLUDING INDIUM, AND METHOD OF MANUFACTURING THE SAME

(75) Inventors: Osamu Shiino, Kiyose (JP); Yoshinori Iwabuchi, Akishima (JP); Ryo Sakurai, Kokubunji (JP); Tatsuya Funaki, Yokohama (JP)

(73) Assignee: Bridgestone Corporation, Tokyo (JP)

( * ) Notice: Subject to any disclaimer, the term of this patent is extended or adjusted under 35 U.S.C. 154(b) by 127 days.

(21) Appl. No.: 12/525,448

(22) PCT Filed: Jan. 30, 2008

(86) PCT No.: PCT/JP2008/051433
§ 371 (c)(1),
(2), (4) Date: Sep. 2, 2009

(87) PCT Pub. No.: WO2008/093741
PCT Pub. Date: Aug. 7, 2008

(65) Prior Publication Data
US 2010/0025680 A1    Feb. 4, 2010

(30) Foreign Application Priority Data
Feb. 2, 2007    (JP) ................................. 2007-023767

(51) Int. Cl.
*H01L 29/15* (2006.01)
(52) U.S. Cl. .................... 257/13; 257/E29.282; 438/149
(58) Field of Classification Search ............... 257/13, 257/43, 57, E21.387, E29.275, E29.282; 438/149, 151, 157, 283
See application file for complete search history.

(56) References Cited

U.S. PATENT DOCUMENTS

| | | | |
|---|---|---|---|
| 6,333,603 B1 * | 12/2001 | Juang et al. | 315/169.3 |
| 2003/0218221 A1 | 11/2003 | Wager, III et al. | |
| 2005/0199959 A1 | 9/2005 | Chiang et al. | |
| 2005/0275038 A1 * | 12/2005 | Shih et al. | 257/382 |
| 2006/0110867 A1 | 5/2006 | Yabuta et al. | |
| 2006/0113539 A1 | 6/2006 | Sano et al. | |

FOREIGN PATENT DOCUMENTS

| | | |
|---|---|---|
| EP | 1950177 A1 | 7/2008 |
| JP | 2005-268724 A | 9/2005 |
| JP | 2006-502597 A | 1/2006 |
| JP | 2006-173580 A | 6/2006 |

OTHER PUBLICATIONS

Extended European Search Report dated Jan. 21, 2010 (7 pages).
International Search Report for PCT/JP2008/051433, mailed Apr. 22, 2008.
Office Action for JP200880006112.0 dated Apr. 21 2011.
EP OA 08704196.8 Jul. 13 2011.

* cited by examiner

Primary Examiner — Thomas L Dickey
(74) Attorney, Agent, or Firm — Sughrue Mion, PLLC

(57) ABSTRACT

In a thin-film transistor comprising respective elements of: three electrodes of a source electrode, a drain electrode and a gate electrode; a channel layer; and a gate insulating film, at least the channel layer is formed by a metal oxide film including indium. Therefore, it is possible to obtain the thin-film transistor, which can manufacture an element to a polymer substrate without using a high temperature process and which can achieve a high performance and a high reliability at low cost.

7 Claims, 5 Drawing Sheets

THIN-FILM TRANSISTOR WITH CHANNEL LAYER FORMED BY METAL OXIDE FILM INCLUDING INDIUM, AND METHOD OF MANUFACTURING THE SAME

TECHNICAL FIELD

The present invention relates to a thin-film transistor, in which a channel layer and electrodes such as a source electrode, a drain electrode and a gate electrode are formed by a metal-oxide film, and a method of manufacturing the same.

RELATED ART

Generally, amorphous silicon is often used for the thin-film transistor. Therefore, it is necessary to use a high-temperature process and an expensive deposition system. Moreover, since it is necessary to use the high-temperature process, it is difficult to manufacture an element made of a polymer substrate.

Therefore, in order to form an electronic device on PET at low cost, it is absolutely necessary to use an easy low-temperature process which needs no complex apparatuses, or to use materials which can obtain sufficient properties by an easy process and a combination thereof, or to develop an easy device construction.

In this case, in order to realize electronic optical devices, it is absolutely necessary to use oxide semiconductors especially transparent oxide semiconductors. Recently, it is reported that a flexible TFT element using an oxide semiconductor made of In—Ga—Zn—O (IGZO) as a channel layer provides excellent properties equal to a-Si. (Non-patent document 1: Nature, 2004, vol. 432, page 488), and it proves a potential of the oxide semiconductors.

However, while IGZO shows very high properties, it contains poisonous Ga and it is necessary to control an oxygen content in a film in a very precise manner. Therefore, there are drawbacks on its handling property and its film-forming controllability. Moreover, since it contains three kinds of metal elements, there is a drawback such that its composition becomes complex. In addition, since it is a material which is not handled until now, there is a drawback such that it is difficult to effect a new installation to a production line.

DISCLOSURE OF THE INVENTION

The present invention is achieved in view of the circumstances mentioned above and has for its object to provide a thin-film transistor and a method of manufacturing the same, which can manufacture an element to a polymer substrate without using a high temperature process and which can achieve a high performance and a high reliability at low cost.

In order to achieve the object mentioned above, the inventors find that the thin-film transistor having excellent performance and reliability can be manufactured in a relatively easy manner without using a high temperature process by forming elements including a channel layer by means of an metal oxide containing indium such as indium oxide ($In_2O_3$), tin doped indium oxide (ITO), and titanium or tungsten doped indium oxide ($InTiO_x$, $InWO_x$).

That is, $In_2O_3$, ITO, $InTiO_x$, and $InWO_x$ can be formed by using a physical vapor deposition such as DC reactive sputtering method, RF sputtering method and pulse laser evaporation method, and thus it is possible to form the channel layer made of $In_2O_3$, ITO, $InTiO_x$, or $InWO_x$ in a relatively easy manner. Therefore, it is possible to form easily an element on a polymer substrate such as PET without using a substrate heating and a high temperature process such as a anneal process after forming a film. Moreover, in the case of effecting a film forming process by the physical vapor depositions mentioned above, it is possible to improve a productivity by using a pulse sputtering method in which a pulse voltage is applied to a cathode so as to obtain a stable discharge or a DUAL cathode sputtering method in which a pulse voltage is alternately applied to a plurality of cathodes. In addition, it is possible to control a composition of the metal oxide film to be obtained by effecting a feedback control by means of PEM (Plasma Emission Monitor) control in which an ion concentration in the plasma is measured and an introduction oxygen amount is controlled in real time. Therefore, it is possible to effect the film forming process in excellent and stable manner without depending on a target condition. Further, it is possible to control a conductivity of the film by adjusting an oxygen defect in the metal oxide film obtained by controlling an introduction oxygen amount during a film-forming process, and thus it is possible to form the channel layer and the electrodes having different electric resistances by the same film-forming device. In this manner, it is possible to manufacture the thin-film transistor in an effective and inexpensive manner.

Therefore, the present invention provide a thin-film transistor comprising respective elements of: three electrodes of a source electrode, a drain electrode and a gate electrode; a channel layer; and a gate insulating film, wherein the channel layer is formed by a metal oxide film including indium.

Moreover, as a manufacturing method thereof, the present invention provide a method of manufacturing a thin-film transistor comprising: forming a metal oxide film including indium and having a predetermined pattern on a substrate by effecting a sputtering process by means of target including indium under an atmosphere including oxygen gas, so that the channel layer and at least one electrodes of the source electrode, the drain electrode and the gate electrode are formed by the metal oxide containing indium; wherein two or more metal oxide films having different electric resistivity are formed by varying a flow rate of oxygen gas, so that the channel layer and at least one of the respective electrodes are formed.

According to the invention, it is possible to obtain the thin-film transistor, which can manufacture an element to a polymer substrate without using a high temperature process and which can achieve a high performance and a high reliability at low cost.

BEST MODE FOR CARRYING OUT THE INVENTION

Hereinafter, the present invention will be explained in detail.

Figure 1:
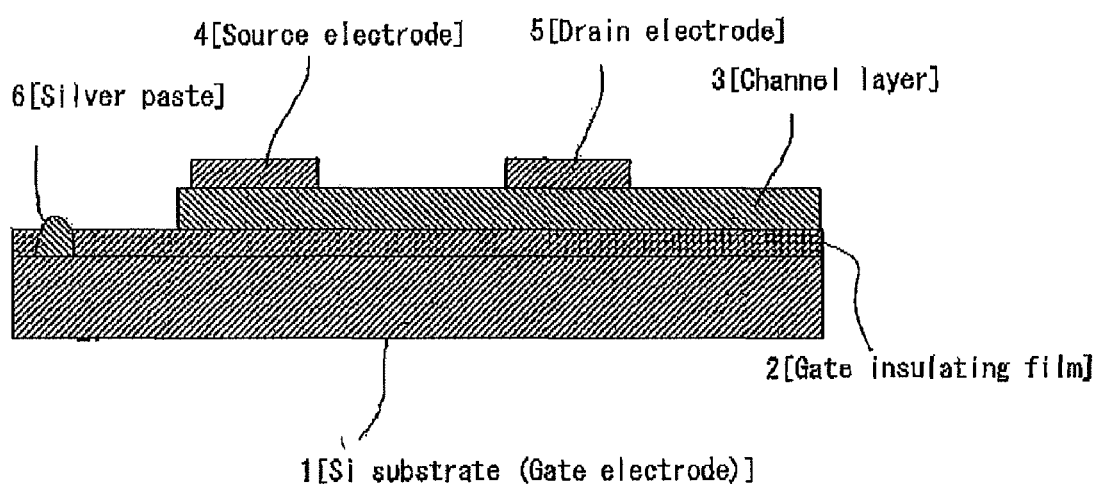
FIG. 1 is a rough cross sectional view showing one embodiment of TFT element (thin-film transistor) according to the invention.

As mentioned above, the thin-film transistor according to the invention has the channel layer formed by the metal oxide film including indium, and one example is the TFT element shown in FIG. 1.

In the thin-film transistor shown in FIG. 1, a channel layer 3 is formed on an Si substrate 1 (gate electrode) wherein a thermally-oxidizing film ($SiO_2$) is formed on its surface as a gate insulating film 2, and a source electrode 4 and a drain electrode 5 are formed on the channel layer 3. According to the invention, at least the channel layer 3 is formed by the metal oxide film including indium in the thin-film transistor mentioned above. In FIG. 1, a numeral 6 is a silver paste 6 which performs an electric conduction with the Si substrate (gate electrode).

As the metal oxide film including indium for forming the channel layer 3 mentioned above, use is preferably made of indium oxide ($In_2O_3$) and indium oxide to which tin, titanium or tungsten is doped (ITO: Thin doped Indium Oxide, $InTiO_x$, $InWO_x$), but it is not limited. Since a transparent conducting film can be obtained by using these $In_2O_3$, ITO, $InTiO_x$, and $InWO_x$, it is possible to manufacture a transparent thin-film transistor. In this case, there are merits as follows. Since $In_2O_3$ includes only oxygen and indium, it is easy to control a film formation. On the other hand, since ITO is generally used as a material for the transparent conducting film, there are numerous accumulated findings for a process management. In addition, a high electron field-effect mobility such as 10 $cm^2/Vsec$ can be obtained. Moreover, $InWO_x$ has a tendency to maintain amorphous properties, and has excellent thermal stability and film flatness.

The channel layer 3 is controlled to be a electric conductivity of $10^{-1}$-$10^6$ $\Omega cm$ normally, 1-$10^5$ $\Omega cm$ especially, but it is not limited. In this case, $In_2O_3$, ITO, $InTiO_x$, and $InWO_x$ have a merit such that it is possible to control an electric conductivity in a relatively easy manner by adjusting a level of oxygen defect during a film-forming process.

As a film-forming method in the case of forming the channel layer 3 by the $In_2O_3$ film, ITO film, $InTiO_x$ film and $InWO_x$ film mentioned above, use may be made of a physical vapor deposition such as DC reactive sputtering method, RF sputtering method and pulse laser evaporation method, and use is preferably made of a sputtering method in which a sputtering is performed by using a target including indium under an atmosphere including oxygen gas. In this case, it is possible to control an amount of oxygen defect of the $In_2O_3$ film, ITO film, $InTiO_x$ film and $InWO_x$ film by varying a flow rate of the oxygen gas, and thus it is possible to adjust the electric resistivity to the resistivity mentioned above which is preferred for the channel layer 3.

As the target used for forming the film by means of the sputtering method mentioned above, use may be made of: In metal target or $In_2O_3$ ceramic target in the case of forming the $In_2O_3$ film; InSn metal target or ITO ceramic target in the case of forming the ITO film; InTi metal target or $InTiO_x$ ceramic target in the case of forming the $InTiO_x$ film; and InW metal target or $InWO_x$ ceramic target in the case of forming the $InWO_x$ film.

In the conventional film-forming method such as the DC reactive sputtering method and the RF sputtering method, since a film-forming speed is relatively low, there is a case such that it is not possible to obtain sufficient productivity. In addition, it is not easy to control a composition of the $In_2O_3$ film, ITO film, $InTiO_x$ film and $InWO_x$ film in a stable manner, and there is a case such that it is difficult to maintain the properties. Therefore, it is possible to improve the productivity by using a DUAL cathode sputtering method in which a pulse voltage is alternately applied to a plurality of cathodes so as to form the film at a high speed, but it is not limited. Further, use is preferably made of a feedback system by means of PEM (Plasma Emission Monitor) control in which an ion concentration in the plasma is measured and an introduction oxygen amount is controlled in real time. In this manner, it is possible to effect a stable composition control and oxygen content control of the thin-film without depending on a target condition.

Then, in the source electrode 4 and the drain electrode 5 mentioned above, use may be made of known materials such as: a transparent electrode material such as ITO, FTO; a metal material such as Au, Pt, Ti, Al if a transparency is not necessary; and various polymer material having conductivity, but it is not limited. It is preferred to form either or both of the source electrode and the drain electrode by the metal oxide film including indium such as the $In_2O_3$ film, the ITO film, the $InTiO_x$ film and the $InWO_x$ film in the same manner as that of the channel layer 3. In this case, it is possible to form the channel layer 3, the source electrode 4 and the drain electrode 5 by the same film-forming device, and thus it is possible to reduce the cost remarkably. Moreover, since a transparency in a range of visible light can be obtained, it is possible to adapt to wide applications.

In this case, the source electrode 4 and the drain electrode 5 need a good conductivity, and their electric conductivity is normally controlled to be $10^{-5}$-$10^{-1}$ $\Omega cm$, especially $10^{-5}$-$10^{-3}$ $\Omega cm$. In the case such that the $In_2O_3$ film, the ITO film, the $InTiO_x$ film and the $InWO_x$ film are formed by the sputtering method in the same manner as that of the channel layer 3 so as to form the source electrode 4 and the drain electrode 5, it is possible to achieve such a low resistivity due to a positive introduction of the oxygen defect by controlling an amount of oxygen introduction. Moreover, it is effective to perform the film-forming process while hydrogen or water is added thereto. Further, in the film-forming process of the electrodes 4 and 5, it is possible to effect a stable composition control and oxygen content control of the thin-film without depending on a target condition by using dual cathode sputtering method or PEM control in the same manner as that of the channel layer 3. In this case, it is possible to perform a film-forming process in a highly reliable manner.

Moreover, in the case such that the source electrode 4 and the drain electrode 5 as well as the channel layer 3 are formed by the metal oxide film including indium such as the $In_2O_3$ film, the ITO film, the $InTiO_x$ film and the $InWO_x$ film by means of the sputtering method, a composition inclined film (conductivity inclined film) in which an oxygen content is gradually varied in the film may be formed to a boundary between the source electrode 4 and the channel layer 3 and a boundary between the drain electrode 5 and the channel layer 3. In this case, a barrier at a boundary between the source electrode 4 and the channel layer 3 or a boundary between the drain electrode 5 and the channel layer 3 is reduced and thus it becomes easy to inject carriers, so that it is promising to improve the properties.

In the TFT element shown in FIG. 1, use is made of the Si substrate having a gate insulating film 2 as the substrate. However, the substrate is not limited to the Si substrate, but use may be made of a substrate generally known as the substrate for electric device such as transistors. For example, instead of the Si substrate, use may be made of: a glass substrate such as white sheet glass, blue sheet glass, quartz glass; a transparent substrate formed by a polymer sheet substrate such as polyethylene terephthalate (PET); and various metal substrates, various plastic substrates and opaque polymer substrates in the case such that a transparency is not necessary to the device.

Moreover, in the TFT element shown in FIG. 1, the Si substrate 1 is used for the gate electrode and an electric conduction with the gate electrode is effected by the silver paste 6. However, use may be made of a insulating substrate and the gate electrode and the gate insulating film may be formed on the substrate separately.

In this case, as to a material for forming the gate electrode, use may be made of the same electrode material as that of source electrode 4 and the drain electrode 5 mentioned above. As a matter of course, the gate electrode may be formed by the $In_2O_3$ film, the ITO film, the $InTiO_x$ film and the $InWO_x$ film by means of the same film-forming device as that of the channel layer 3. In this case, the electric conductivity of the gate electrode may be controlled to be $10^{-5}$-$10^{-1}$ Ωcm, especially $10^{-5}$-$10^{-3}$ Ωcm as is the same as the source electrode 4 and the drain electrode 5.

Moreover, as to a material of the gate insulating film mentioned above, use may be made of a known metal oxide such as $SiO_2$, $Y_2O_3$, $Ta_2O_5$, Hf oxide and known insulating polymer material such as polyimide, and the film may be formed by the known method. The electric conductivity of the gate insulating film may be controlled to be $1\times10^6$-$1\times10^{15}$ Ωcm especially $1\times10^{10}$-$1\times10^{15}$ Ωcm.

A type of the oxide transistor according to the invention is not limited to a bottom gate—top contact type shown in FIG. 1, but use may be made of a bottom gate—bottom contact type, a top gate—bottom contact type, a top gate—top contact type and the other types.

EMBODIMENT

Hereinafter, the present invention will be explained in detail with reference to the embodiments, but the present invention is not limited to the following embodiments.

Example 1

Figure 2:
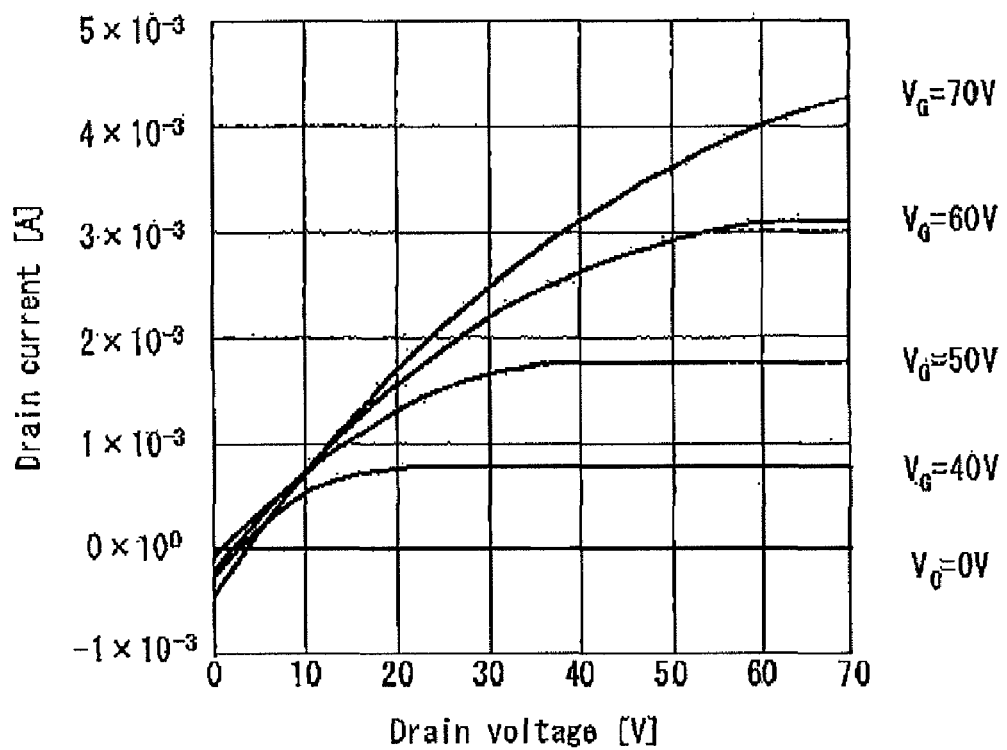
FIG. 2 is a graph illustrating operating characteristics of the TFT element (thin-film transistor) manufactured according to the example 1.
Figure 2:
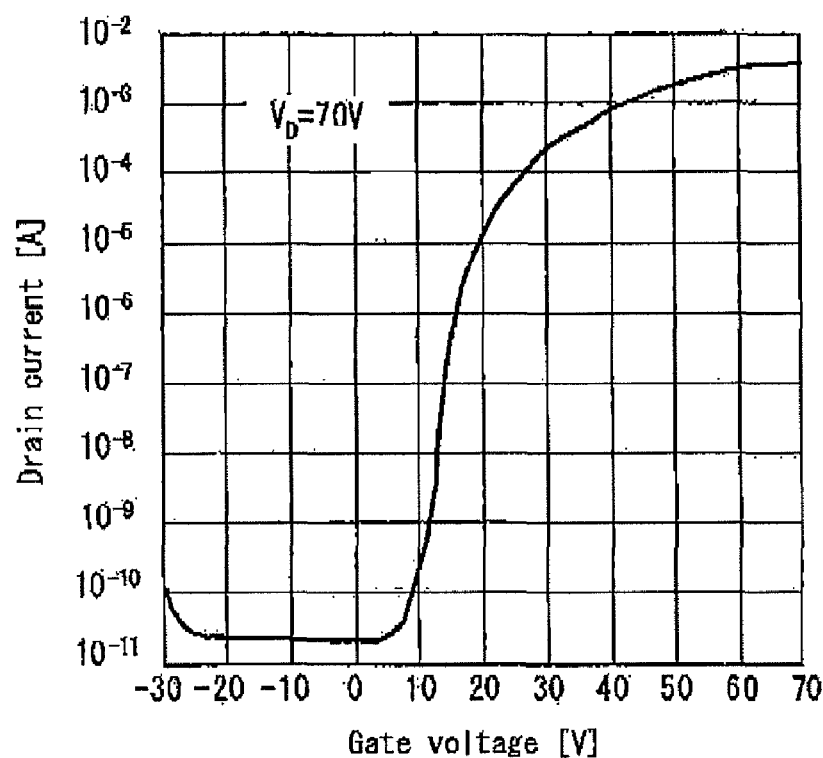

An indium oxide film having a thickness of 50 nm was formed as a channel layer on a silicon wafer in which a thermally-oxidizing film ($SiO_2$) was formed on its surface as a gate insulating film. The film-forming process was performed by DC magnetron sputtering method under the following sputtering conditions.
Sputtering Conditions
    Target: $In_2O_3$ sintered body (size 75 mm ϕ)
    Ultimate vacuum: $5.0\times10^{-4}$ Pa
    Pressure during film-forming: 0.5 Pa
    Applied power: 150 W
    Used substrate: silicon wafer with thermally-oxidizing film (thickness of thermally-oxidizing film ~300 nm)
    Gas flow rate during film-forming: $Ar/O_2$=99/0.7 sccm A source electrode and a drain electrode both having a thickness of 50 nm were further formed on the thus obtained channel layer so as to manufacture a thin-film transistor (TFT element) having a construction shown in FIG. 1. As the electrode, use was made of indium oxide film formed by using the same target as that of the channel layer mentioned above and the same film-forming device but by varying only the film-forming conditions, in which a pattering was performed by using a metal mask to be a channel length of 0.1 mm and a channel width of 6.4 mm. The film-forming conditions (sputtering conditions) of the source electrode and the drain electrode were as follows.
Sputtering Conditions
    Target: $In_2O_3$ sintered body (size 75 mm ϕ)
    Ultimate vacuum: $5.0\times10^{-4}$ Pa
    Pressure during film-forming: 0.5 Pa
    Applied power: 150 W
    Used substrate: silicon wafer with thermally-oxidizing film (thickness of thermally-oxidizing film ~300 nm)
    Gas flow rate during film-forming: $Ar/O_2$=99/0.7 sccm Operating characteristics of the thus obtained element were investigated by using a semiconductor parameter analyzer "4155C" manufactured by Agilent Co. LTD. The results were shown in a graph of FIG. 2. As shown in FIG. 2, the operating characteristics as the TFT element could be confirmed, and excellent values such as on/off ratio of above $10^8$ and electron field-effect mobility of about 5.74 $cm^2$/Vsec could be obtained.

Example 2

Figure 3:
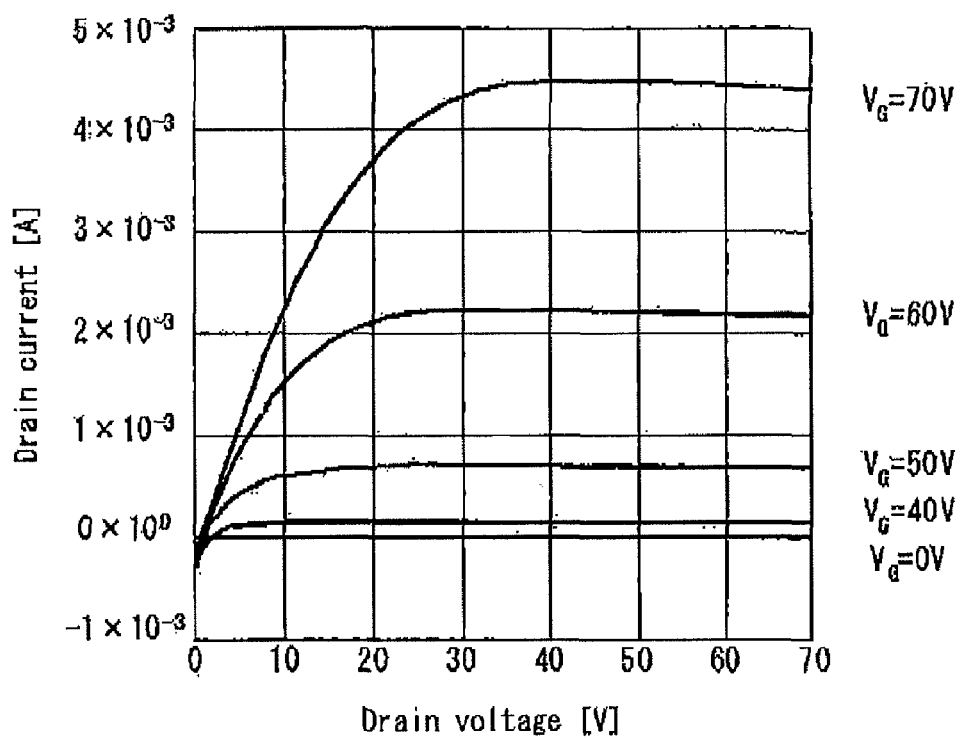
FIG. 3 is a graph illustrating operating characteristics of the TFT element (thin-film transistor) manufactured according to the example 2.
Figure 3:
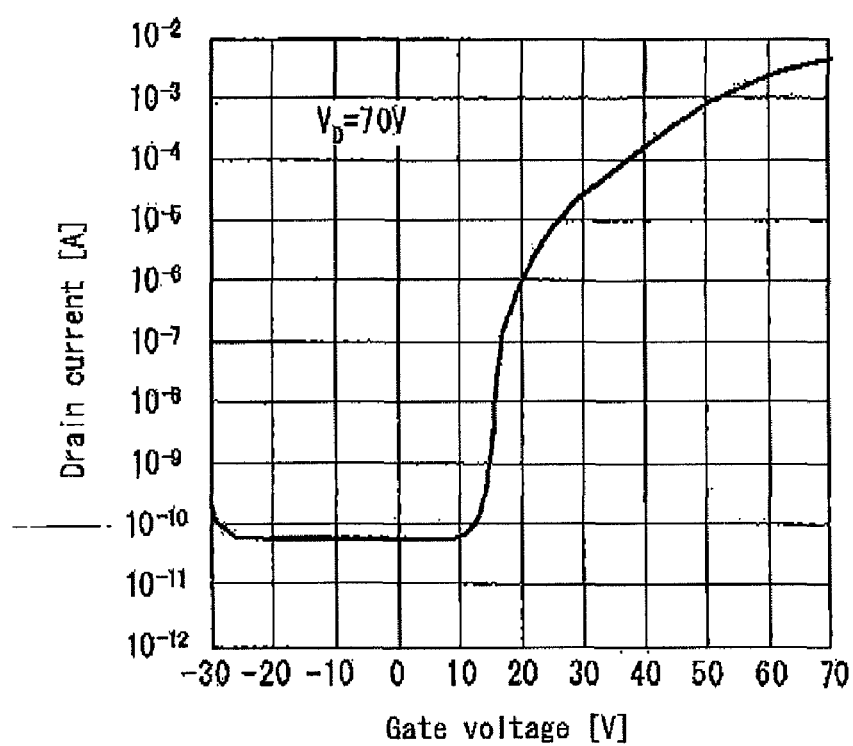

An ITO film having a thickness of 50 nm was formed as a channel layer on a silicon wafer substrate in which a thermally-oxidizing film ($SiO_2$) was formed on its surface as a gate insulating film. The film-forming process was performed by DC magnetron sputtering method under the following sputtering conditions.
Sputtering Conditions
    Target: ITO sintered body (size 75 mm ϕ, In:Sn=90:10 atm %)
    Ultimate vacuum: $5.0\times10^{-4}$ Pa
    Pressure during film-forming: 0.5 Pa
    Applied power: 150 W
    Used substrate: silicon wafer with thermally-oxidizing film (thickness of thermally-oxidizing film ~300 nm)
    Gas flow rate during film-forming: $Ar/O_2$=95/5 sccm A source electrode and a drain electrode both having a thickness of 50 nm were further formed on the thus obtained channel layer so as to manufacture a thin-film transistor (TFT element) having a construction shown in FIG. 1. As the electrode, use was made of ITO film formed by using the same target as that of the channel layer mentioned above and the same film-forming device but by varying only the film-forming conditions, in which a pattering was performed by using a metal mask to be a channel length of 0.1 mm and a channel width of 6.4 mm. The film-forming conditions (sputtering conditions) of the source electrode and the drain electrode were as follows.
Sputtering Conditions
    Target: ITO sintered body (size 75 mm ϕ, In:Sn=90:10 atm %)
    Ultimate vacuum: $5.0\times10^{-4}$ Pa
    Pressure during film-forming: 0.5 Pa
    Applied power: 150 W
    Used substrate: silicon wafer with thermally-oxidizing film (thickness of thermally-oxidizing film ~300 nm)
    Gas flow rate during film-forming: $Ar/O_2$=99/0.7 sccm As is the same as the example 1, operating characteristics of the thus obtained element were investigated by using a semiconductor parameter analyzer "4155C" manufactured by Agilent Co. LTD. The results were shown in a graph of FIG. 3. As shown in FIG. 3, the operating characteristics as the TFT element could be confirmed, and excellent values such as on/off ratio of above $10^8$ and electron field-effect mobility of about 12.7 $cm^2$/Vsec could be obtained.

Example 3

An $InTiO_x$ film having a thickness of 50 nm was formed as a channel layer on a silicon wafer substrate in which a thermally-oxidizing film ($SiO_2$) was formed on its surface as a gate insulating film. The film-forming process was performed by DC magnetron sputtering method under the following sputtering conditions.
Sputtering Conditions
    Target: $InTiO_x$ sintered body (size 75 mm ϕ, Ti: 10%)
    Ultimate vacuum: $5.0\times10^{-4}$ Pa
    Pressure during film-forming: 0.5 Pa
    Applied power: 150 W Used substrate: silicon wafer with thermally-oxidizing film (thickness of thermally-oxidizing film ~300 nm)
Gas flow rate during film-forming: Ar/O$_2$=95/5 sccm A source electrode and a drain electrode both having a thickness of 50 nm were further formed on the thus obtained channel layer so as to manufacture a thin-film transistor (TFT element) having a construction shown in FIG. 1. As the electrode, use was made of InTiO$_x$ film formed by using the same target as that of the channel layer mentioned above and the same film-forming device but by varying only the film-forming conditions, in which a pattering was performed by using a metal mask to be a channel length of 0.1 mm and a channel width of 6.4 mm. The film-forming conditions (sputtering conditions) of the source electrode and the drain electrode were as follows.

Figure 4:
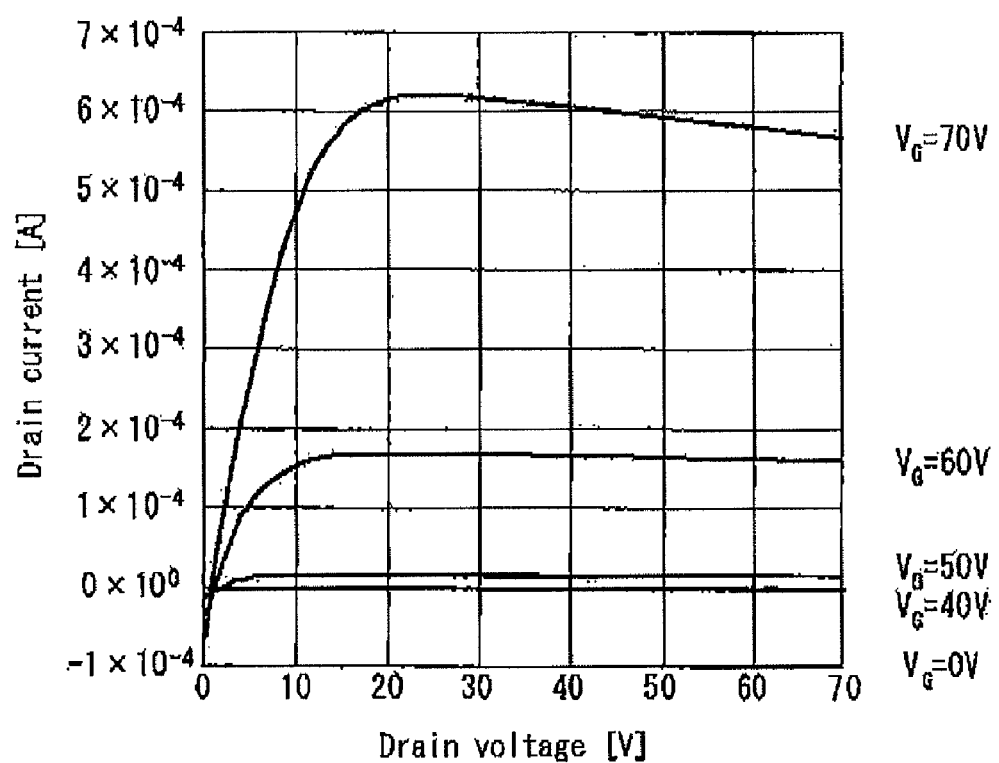
FIG. 4 is a graph illustrating operating characteristics of the TFT element (thin-film transistor) manufactured according to the example 3.
Figure 4:
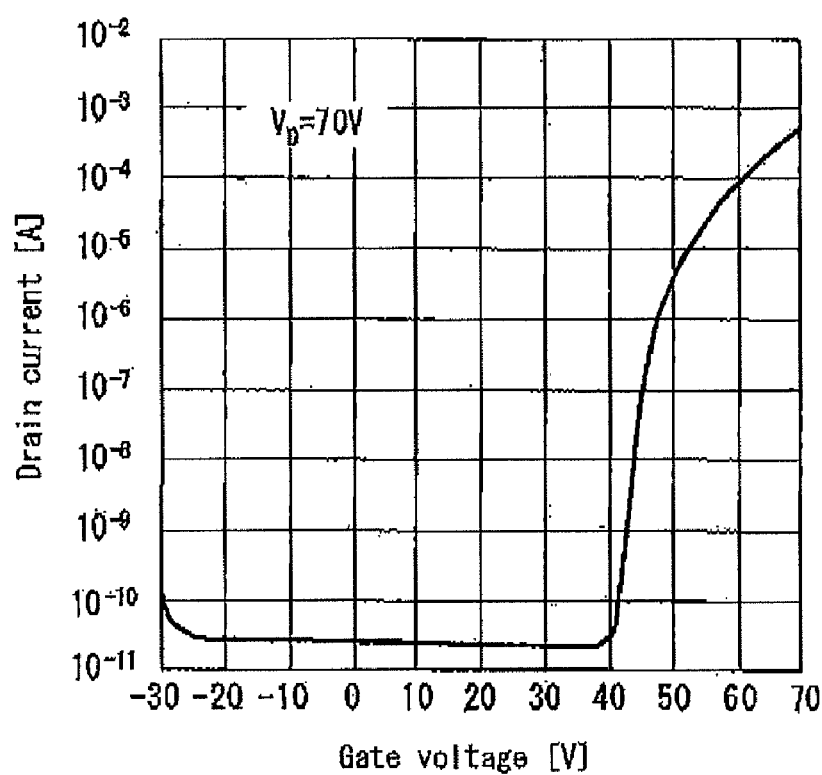

Sputtering Conditions
  Target: InTiO$_x$ sintered body (size 75 mm φ, Ti: 10%)
  Ultimate vacuum: 5.0×10$^{-4}$ Pa
  Pressure during film-forming: 0.5 Pa
  Applied power: 150 W
  Used substrate: silicon wafer with thermally-oxidizing film (thickness of thermally-oxidizing film ~300 nm)
  Gas flow rate during film-forming: Ar/O$_2$=99/0.7 sccm As is the same as the example 1, operating characteristics of the thus obtained element were investigated by using a semiconductor parameter analyzer "4155C" manufactured by Agilent Co. LTD. The results were shown in a graph of FIG. 4. As shown in FIG. 4, the operating characteristics as the TFT element could be confirmed, and excellent values such as on/off ratio of above 10$^7$ and electron field-effect mobility of about 5.0 cm$^2$/Vsec could be obtained.

Example 4

An InWO$_x$ film having a thickness of 50 nm was formed as a channel layer on a silicon wafer substrate in which a thermally-oxidizing film (SiO$_2$) was formed on its surface as a gate insulating film. The film-forming process was performed by DC magnetron sputtering method under the following sputtering conditions.

Sputtering Conditions
  Target: InWO$_x$ sintered body (size 75 mm φ, W: 1%)
  Ultimate vacuum: 5.0×10$^{-4}$ Pa
  Pressure during film-forming: 0.5 Pa
  Applied power: 150 W
  Used substrate: silicon wafer with thermally-oxidizing film (thickness of thermally-oxidizing film ~300 nm)
  Gas flow rate during film-forming: Ar/O$_2$=95/5 sccm A source electrode and a drain electrode both having a thickness of 50 nm were further formed on the thus obtained channel layer so as to manufacture a thin-film transistor (TFT element) having a construction shown in FIG. 1. As the electrode, use was made of InWO$_x$ film formed by using the same target as that of the channel layer mentioned above and the same film-forming device but by varying only the film-forming conditions, in which a pattering was performed by using a metal mask to be a channel length of 0.1 mm and a channel width of 6.4 mm. The film-forming conditions (sputtering conditions) of the source electrode and the drain electrode were as follows.

Figure 5:
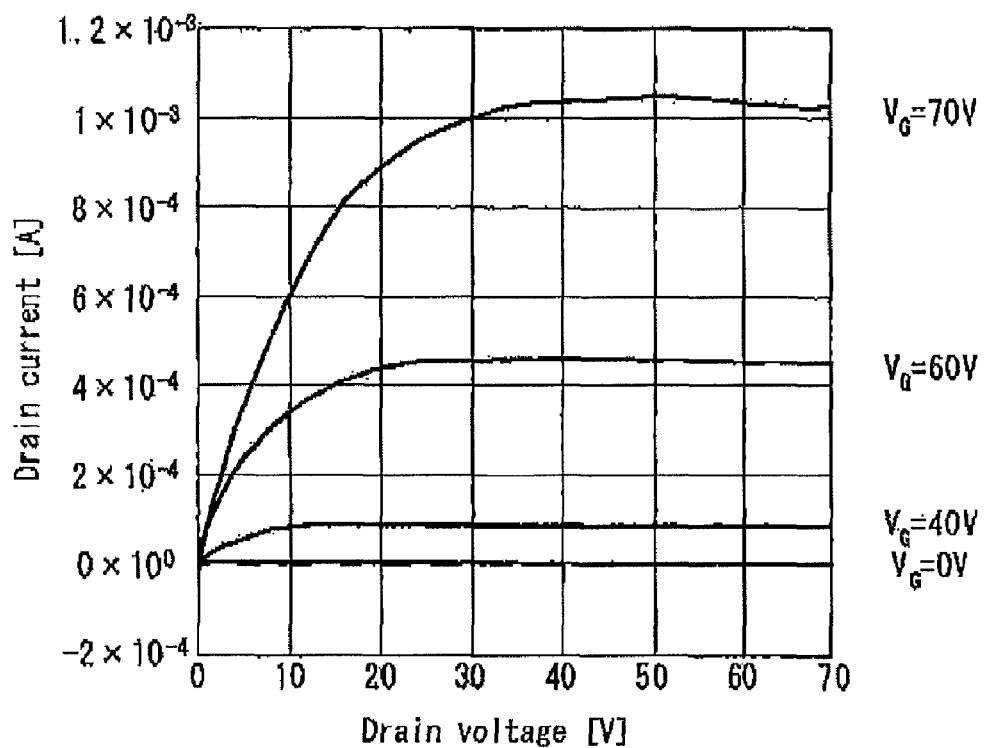
FIG. 5 is a graph illustrating operating characteristics of the TFT element (thin-film transistor) manufactured according to the example 4.
Figure 5:
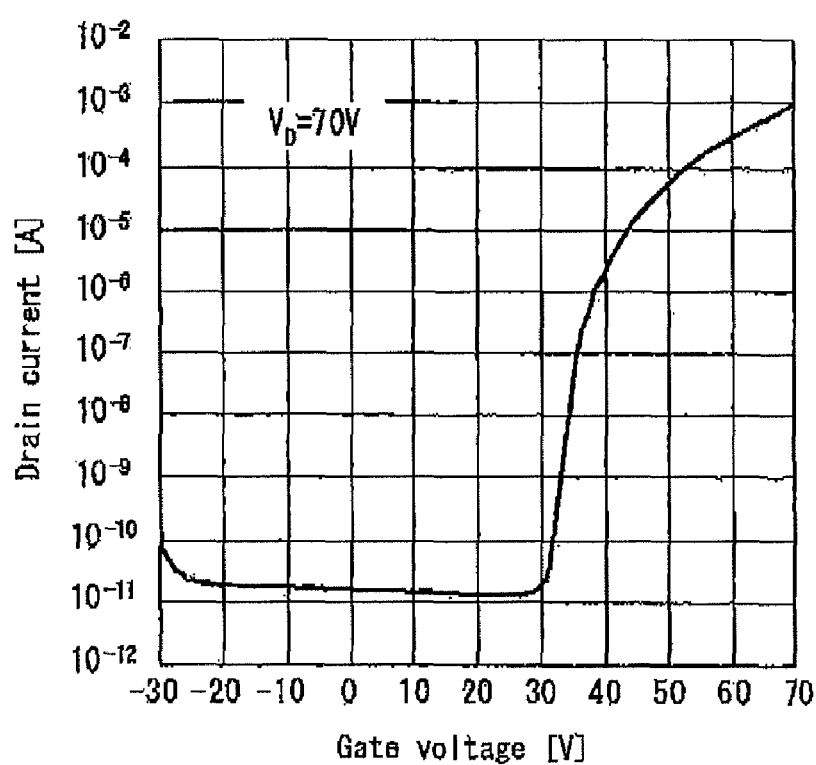

Sputtering Conditions
  Target: InWO$_x$ sintered body (size 75 mm φ, W: 1%)
  Ultimate vacuum: 5.0×10$^{-4}$ Pa
  Pressure during film-forming: 0.5 Pa
  Applied power: 150 W
  Used substrate: silicon wafer with thermally-oxidizing film (thickness of thermally-oxidizing film ~300 nm)
  Gas flow rate during film-forming: Ar/O$_2$=99/0.7 sccm As is the same as the example 1, operating characteristics of the thus obtained element were investigated by using a semiconductor parameter analyzer "4155C" manufactured by Agilent Co. LTD. The results were shown in a graph of FIG. 5. As shown in FIG. 5, the operating characteristics as the TFT element could be confirmed, and excellent values such as on/off ratio of above 10$^8$ and electron field-effect mobility of about 4.5 cm$^2$/Vsec could be obtained.

INDUSTRIAL APPLICABILITY

The present invention can be applied to a technical field having a requirement to obtain the thin-film transistor, which can manufacture an element to a polymer substrate without using a high temperature process and which can achieve a high performance and a high reliability at low cost.

The invention claimed is:

1. A thin-film transistor comprising respective elements of: three electrodes of a source electrode, a drain electrode and a gate electrode; a channel layer; and a gate insulating film, wherein the channel layer is formed by indium oxide to which titanium or tungsten is doped.

2. The thin-film transistor according to claim 1, wherein at least one of the source electrode, the drain electrode and the gate electrode is formed by the same indium oxide as that of the channel layer in which an excellent conductivity is applied by introducing an oxygen defect.

3. The thin-film transistor according to claim 1, wherein the indium oxide is formed by sputtering a target including indium under an atmosphere including oxygen gas.

4. The thin-film transistor according to claim 3, wherein the film of the indium oxide is formed by sputtering under a condition such that a substrate for forming the respective elements is not heated, and, is obtained by effecting no anneal process after the forming the film.

5. A method of manufacturing a thin-film transistor comprising: forming an indium oxide film, to which titanium or tungsten is doped, and having a predetermined pattern on a substrate by effecting a sputtering process by means of a sintered body of indium oxide, to which titanium or tungsten is doped, as a target, under an atmosphere including oxygen gas, so that the channel layer and at least one electrodes of the source electrode, the drain electrode and the gate electrode are formed by the indium oxide film, to which titanium or tungsten is doped; wherein two or more indium oxide films, to which titanium or tungsten is doped, having different electric resistivity are formed by varying a flow rate of oxygen gas, so that the channel layer and at least one of the respective electrodes are formed.

6. The method of manufacturing a thin-film transistor according to claim 5, wherein the indium oxide is formed by sputtering under a condition such that a substrate for forming the respective elements is not heated, and, is obtained by effecting no anneal process after the formation.

7. The method of manufacturing a thin-film transistor according to claim 5, wherein an indium oxide layer having an electric resistivity of 10$^{-1}$-10$^6$ Ωcm is formed as the channel layer, and, an indium oxide layer having an electric resistivity of 10$^{-5}$-10$^{-1}$ Ωcm, in which an oxygen defect is introduced by varying a flow rate of oxygen gas, is formed as the electrode.

* * * * *